(12) United States Patent
Ohashi

(10) Patent No.: US 8,486,288 B2
(45) Date of Patent: Jul. 16, 2013

(54) PATTERN FORMING METHOD

(75) Inventor: Takashi Ohashi, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 252 days.

(21) Appl. No.: 13/049,419

(22) Filed: Mar. 16, 2011

(65) Prior Publication Data

US 2011/0226725 A1    Sep. 22, 2011

(30) Foreign Application Priority Data

Mar. 19, 2010    (JP) .................................. 2010-065237

(51) Int. Cl.
*B44C 1/22* (2006.01)
*B82Y 40/00* (2011.01)
*H01L 21/302* (2006.01)

(52) U.S. Cl.
USPC .................. 216/44; 216/46; 216/52; 216/53; 216/67; 216/72; 438/694; 438/696; 438/947; 977/887; 977/888

(58) Field of Classification Search
None
See application file for complete search history.

(56) References Cited

U.S. PATENT DOCUMENTS

| | | | | |
|---|---|---|---|---|
| 5,772,905 | A * | 6/1998 | Chou | 216/44 |
| 2005/0118817 | A1 * | 6/2005 | Fujita et al. | 438/689 |
| 2006/0211256 | A1 | 9/2006 | Takei et al. | |
| 2009/0087991 | A1 | 4/2009 | Yatsuda et al. | |
| 2009/0140458 | A1 * | 6/2009 | Xu et al. | 264/293 |
| 2009/0166933 | A1 * | 7/2009 | Sreenivasan | 264/496 |
| 2010/0104852 | A1 * | 4/2010 | Fletcher et al. | 428/315.5 |

FOREIGN PATENT DOCUMENTS

| | | |
|---|---|---|
| JP | 2001-196376 | 7/2001 |
| JP | 2009-038085 | 2/2009 |
| JP | 2009-88085 | 4/2009 |
| WO | WO 2004/092840 A1 | 10/2004 |

OTHER PUBLICATIONS

Office Action issued Jul. 10, 2012 in Japanese Application No. 2010-065237 (English Translation).

* cited by examiner

*Primary Examiner* — Anita Alanko
(74) *Attorney, Agent, or Firm* — Oblon, Spivak, McClelland, Maier & Neustadt, L.L.P.

(57) ABSTRACT

A pattern forming method including: (a) forming a porous layer above an etching target layer; (b) forming an organic material with a transferred pattern on the porous layer; (c) forming, by use of the transferred pattern, a processed pattern in a transfer oxide film that is more resistant to etching than the porous layer; and (d) transferring the processed pattern to the etching target layer by use of the transfer oxide film as a mask.

12 Claims, 3 Drawing Sheets

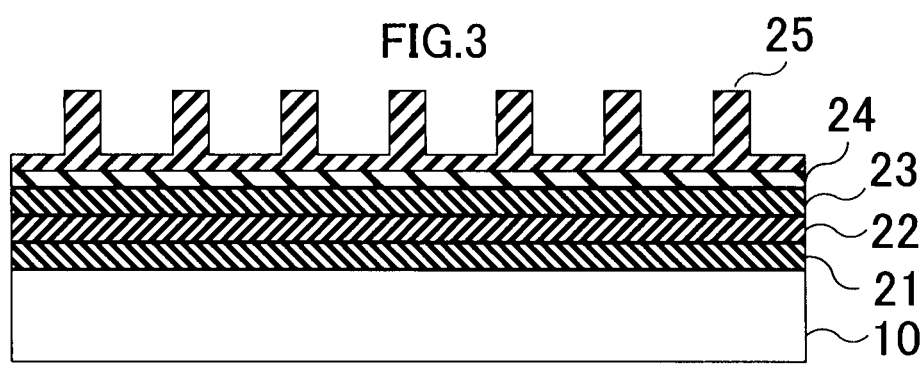

PATTERN FORMING METHOD

CROSS-REFERENCE TO RELATED APPLICATIONS

This application is based upon and claims the benefit of priority from the prior Japanese Patent Application No. 2010-65237, filed Mar. 19, 2010, the entire contents of which are incorporated herein by reference.

FIELD

Embodiments described herein relate generally to a pattern forming method using nanoimprint lithography.

BACKGROUND

The advance of miniaturization of semiconductor devices has increased the difficulty in performing microfabrication by use of a conventional photolithography technique, and alternative techniques to replace the conventional technique have been demanded. Nanoimprint lithography (NIL) is gaining increasing attention as one of such alternative techniques.

According to the nanoimprint lithography technique, in a state that a mold (e.g., a template) having recesses and protrusions corresponding to a pattern to be transferred is brought into pressure contact with a light-curable substance applied to, for example, a substrate to be treated, the light-curable substance is cured by irradiation with light from the back surface of the mold; and thereby the pattern formed in the mold is transferred.

BRIEF DESCRIPTION OF THE DRAWINGS

FIG. 3 is a sectional process drawing showing a process included in a pattern forming method according to a second embodiment.

DETAILED DESCRIPTION

Figure 1A:
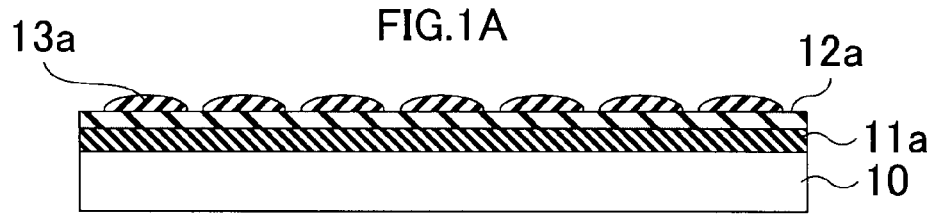
FIGS. 1A to 1D are sectional process drawings showing a pattern forming method according to a first embodiment.

Before describing exemplary embodiments, descriptions are given of the context that has led the inventors to the exemplary embodiments.

In the nanoimprint lithography technique, when a template is brought into pressure contact with a light-curable organic material applied to, for example, an etching target layer (e.g., a silicon substrate) in an environment of air or a replacement gas, bubbles (of the air or the replacement gas) mixed in the organic material sometimes cause defects in the organic material. To discharge the bubbles for preventing the defects, the template needs to be kept in pressure contact with the organic material in, for example, a helium-gas atmosphere for a long time.

With this taken into consideration, the inventors have studied a method in which a porous layer (e.g., a porous oxide film) is formed immediately beneath the organic material, as a method for discharging the helium gas, which is mixed in the organic material, in a short time. The inventors formed the porous layer immediately beneath the organic material. As a result, the inventors experimentally confirmed that bubbles in the organic material can be reduced in a much shorter time by discharging the helium gas, which is mixed in the organic material, through the porous layer. The porous layer in this technique is formed between the organic material and the etching target layer.

When a desired pattern is formed in the etching target layer, however, the pattern needs to be transferred to the porous layer formed between the organic material and the etching target layer. The porous layer is less resistant to etching than the etching target layer. Hence, if dry etching (e.g., reactive ion etching (RIE)) is applied to the etching target layer by using the porous layer with the transferred pattern as a mask, it is likely that: the porous layer is etched before, for example, the etching target layer; and the desired pattern cannot be formed in the etching target layer.

In view of the circumstances described above, the below discussed exemplary embodiments provide a pattern forming method capable of forming a microscopic pattern even if a porous layer having lower etching resistance than an etching target layer is used immediately beneath the organic material.

Some exemplary embodiments are described below by referring to the drawings. In the descriptions that follow, the same portions are denoted by the same reference numerals throughout the drawings. In addition, the dimensional ratios in the drawings are not limited to illustrated ones.

Using sectional process drawings of FIGS. 1 and 2, a pattern forming method according to a first embodiment is described by giving an example of a method of forming a half-pitch pattern using a sidewall processing technique.

Firstly, as FIG. 1A shows, a light-curable organic material 13a is applied to a transfer-receiving layer 11a (hereafter referred to as a first transfer-receiving layer; for example a carbon layer) and a porous layer 12a formed on and above an etching target layer 10. In this respect, the porous layer 12a is formed either by a chemical vapor deposition (CVD) process or by a coating process, for example, at a temperature of 300° C. to 350° C. To be more specific, as the porous layer 12a, an oxide film (e.g., a laminate film of $SiO_2$ and SiO) having a lower density than an oxide film formed by a low-pressure chemical vapor deposition (LPCVD) process can be used. The density of the porous layer 12a is, for example, approximately 1.5 g/cm$^3$ to 1.8 g/cm$^3$. When the density of the porous layer 12a is lower than 1.8 g/cm$^3$, the time needed to discharge the helium gas can be reduced by half compared to the other cases. As the density is decreased, it becomes easier to discharge the helium gas, and the time needed to this end can be made shorter.

The organic material 13a can be applied by spraying organic-material droplets by an inkjet technique, and FIGS. 1A to 1D show enlarged views of some of the droplets thus applied.

Figure 1B:
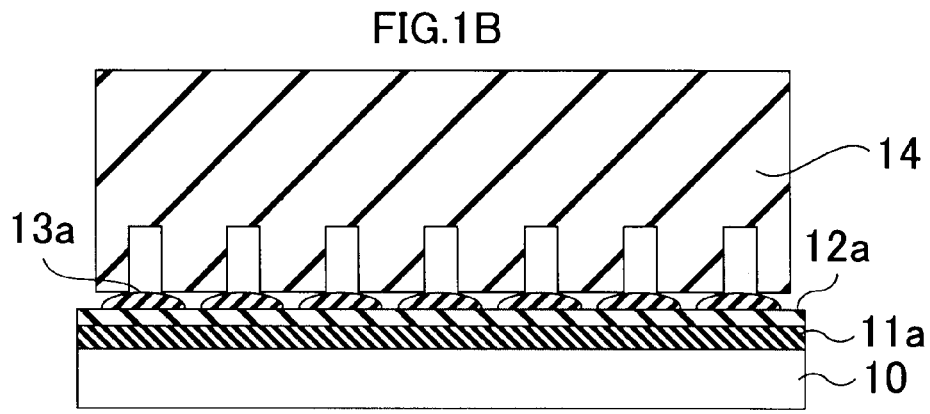
Figure 1C:
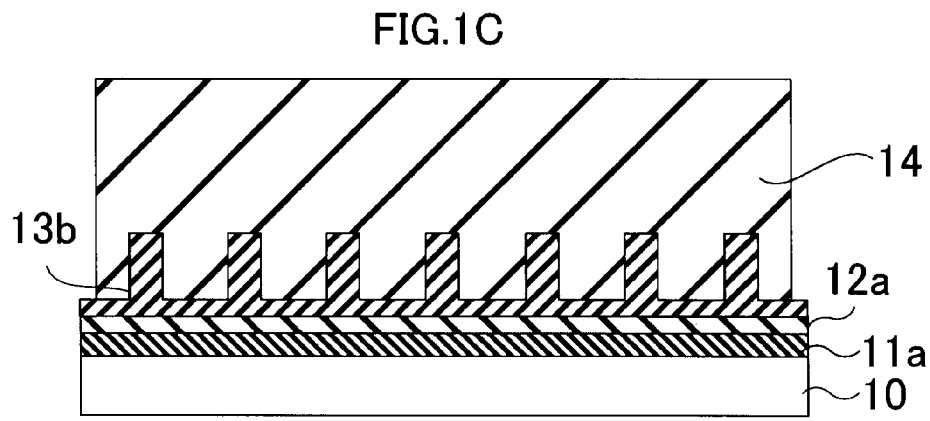

Then, as FIG. 1B shows, a template 14 with a desired pattern formed therein is brought into contact with the organic material 13a. Then, as FIG. 1C shows, the template 14 is put in pressure contact with the organic material 13a, and is held in that state until the organic material 13b is spread into the entire pattern of the template 14 by capillary action.

Figure 1D:
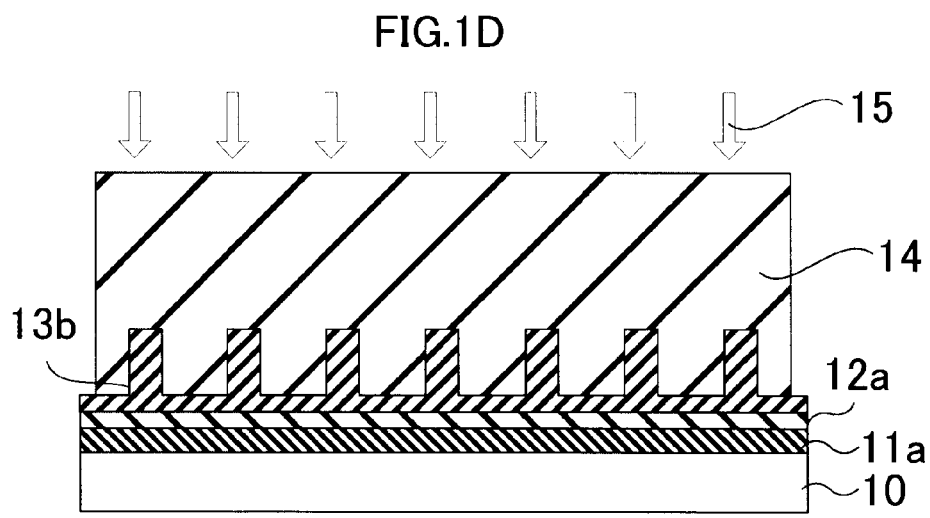
Figure 2A:
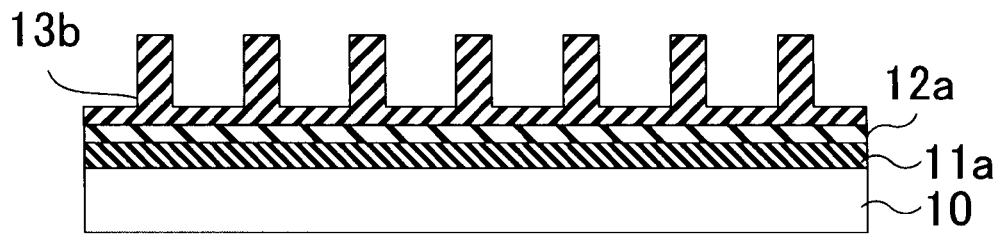
FIGS. 2A to 2E are sectional process drawings showing a pattern forming method according to the first embodiment.

Then, as FIG. 1D shows, the organic material 13b is cured by, for example, irradiation of UV rays 15. After that, as FIG. 2A shows, the template 14 is removed from the organic material 13b. Thus, the organic material 13b is formed in which a pattern inverted from the pattern of the template 14 is transferred (hereafter, the inverted pattern is referred to as the transferred pattern A).

Figure 2B:
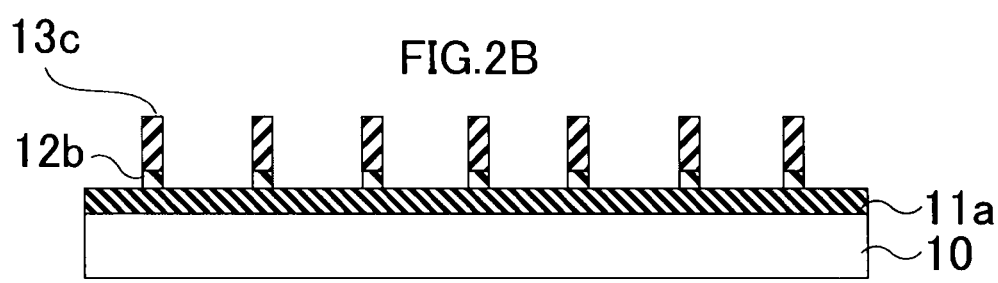

Then, as FIG. 2B shows, an organic material 13c is formed with either the dry-etching technique or the wet-etching technique. The resultant pattern of the organic material 13c (hereafter the pattern is referred to as the transferred pattern B) is slimmed down with the sidewall portions etched laterally inward. The porous layer 12a is processed with the dry etching (e.g., RIE) technique by using this organic material 13c as a mask. Thus, a pattern (transferred pattern C) is formed as a porous layer 12b.

Figure 2C:
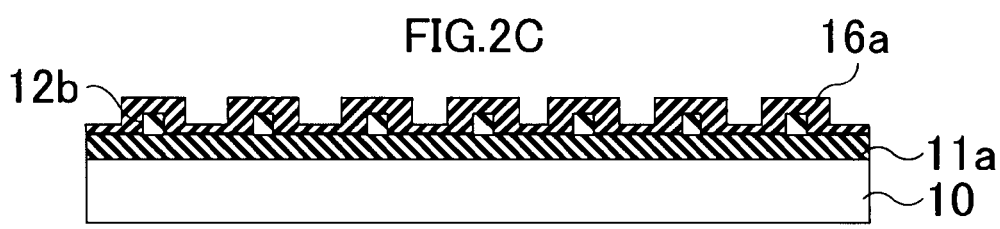

Subsequently, as FIG. 2C shows, the organic material 13c is removed, and then a transfer oxide film 16a is formed on the first transfer-receiving layer 11a and the porous layer 12b. The transfer oxide film 16a uses an oxide film with etching resistance higher than that of the porous layer 12b, for example a $SiO_2$ film. The transfer oxide film 16a is formed by, for example, a CVD process at room temperature.

Figure 2D:
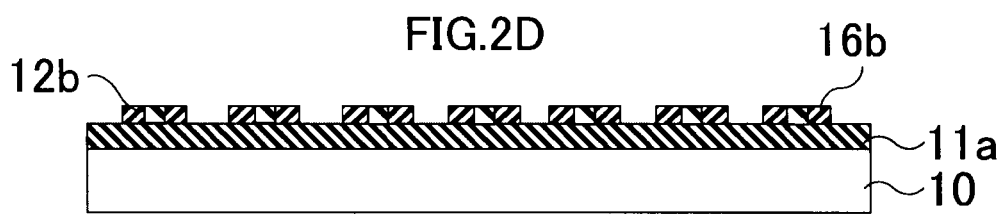

Then, as FIG. 2D shows, the transfer oxide film 16a is etched back until the top surface of the porous layer 12b is exposed. To this end the transfer oxide film 16a can be dry-etched with a CF-based gas (e.g. $C_4F_8$ $CHF_3$, $CF_4$, or $C_4F_6$). Note that a mixed gas containing any of the above-mentioned CF-based gas may be used.

Figure 2E:
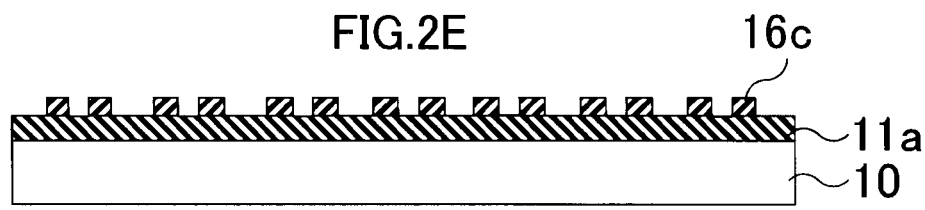

As FIG. 2E shows, the porous layer 12b alone is selectively dry-etched by using the difference in the etching resistance between the transfer oxide film 16b and the porous layer 12b. Hereafter, the resultant pattern formed in the transfer oxide film 16c after the dry-etching is referred to as the processed pattern.

Then, the first transfer-receiving layer 11a to which the processed pattern is transferred is formed with the transfer oxide film 16c used as a mask. If the first transfer-receiving oxide film 11a is, for example, a carbon film, the first transfer-receiving oxide film 11a is dry-etched with an oxygen gas or the like. Then, the etching target layer 10 is dry-etched with this first transfer-receiving layer 11a used as a mask. Thus formed is the etching target layer 10 with the processed pattern transferred thereto.

Note that, if the desired pattern can be formed in the etching target layer 10 with the transfer oxide film 16c used as a mask, the first transfer-receiving layer 11a need not be formed.

As has been described, in this embodiment, the etching target layer 10, to which the processed pattern is transferred, is not formed using the porous layer 12, but instead the transfer oxide film 16. In the dry-etching of the first transfer-receiving oxide film 11a and the etching target layer 10 by using the oxygen gas, the transfer oxide film 16 survives because the transfer oxide film 16 is not etched before the first transfer-receiving oxide film 11a and the etching target layer 10 are etched.

Accordingly, this embodiment can provide a method capable of forming a microscopic pattern by using the nanoimprint lithography process even if the porous layer 12, which is less resistant to etching than the etching target layer 10, is formed between the etching target layer 10 and the organic material 13.

In this embodiment, a half-pitch pattern is formed in the etching target layer 10 by the sidewall-processing technique. In a first possible modification, however, the pattern may be formed in the etching target layer 10, to which the processed pattern that is the same as the transferred pattern is transferred, without using the sidewall-processing technique.

For example, after a transferred pattern E is formed in the porous layer 12 by using the organic material 13 with a transferred pattern D formed therein as a mask, the transfer oxide film 16 is formed on the porous layer 12. Here, the transfer oxide film 16 is formed to bury the transferred pattern E of the porous layer 12. Then, the transfer oxide film 16 is etched back until the top surface of the porous layer 12 is exposed. Then, the porous layer 12 is removed. Thus, the processed pattern is formed in the transfer oxide film 16.

Then, the processed pattern is transferred to the etching target layer 10 with the transfer oxide film 16 used as a mask.

As has been described, as in the above-described first embodiment, the etching target layer 10 with the processed pattern transferred thereto is not formed using the porous layer 12, but instead the transfer oxide film 16. Accordingly, even if the porous layer 12, which is less resistant to etching than the etching target layer 10, is formed between the etching target layer 10 and the organic material 13, a microscopic pattern can be easily formed by using nanoimprint lithography.

Next, a pattern forming method of a second embodiment is described by referring to a sectional process drawing of a process shown in FIG. 3. The pattern forming method of the second embodiment differs from that of the first embodiment in that, as FIG. 3 shows, an oxide film 22 of the same kind as the transfer oxide film is formed beforehand between a first transfer-receiving layer 21 and a porous layer 24 (note that the oxide film 22 is also referred to as the transfer oxide film). The descriptions that follow focus on different points from the pattern forming method of the first embodiment.

As FIG. 3 shows, on and over the etching target layer 10, the first transfer-receiving layer 21 (e.g., a carbon layer), the transfer oxide film 22, a transfer-receiving layer (hereafter referred to as the second transfer-receiving layer) 23, and the porous layer 24 are formed in this order from the bottom. A light-curable organic material 25 is applied onto the porous layer 24. A desired template (not illustrated) is brought into pressure contact with the organic material 25, and then the organic material 25 is cured by, for example, irradiation of UV rays. Thus formed is the organic material 25 of a transferred pattern.

This transferred pattern of the organic material 25 is then transferred sequentially to the porous layer 24, the second transfer-receiving layer 23, the transfer oxide film 22, and the first transfer-receiving layer 21.

To be specific, using the organic material 25 as a mask, the porous layer 24 is dry-etched to transfer the transferred pattern to the porous layer 24. Then, using the porous layer 24 as a mask, the second transfer-receiving layer 23 is dry-etched to transfer the transferred pattern to the second transfer-receiving layer 23. When the porous layer 24 is dry-etched, a CF-based gas, such as $C_4F_8$, $CHF_3$, $CF_4$, and $C_4F_6$ is used. On the other hand, when the second transfer-receiving layer 23 is dry-etched, either an oxygen gas or a mixed gas of oxygen and other gases is used if the second transfer-receiving layer 23 is made of, for example, a carbon film.

Then, the transfer oxide film 22 is dry-etched using the second transfer-receiving layer 23 as a mask, and thereby the processed pattern is formed.

Then, using the first transfer-receiving layer 21 as a mask, the processed pattern is transferred to the etching target layer 10.

As has been described, in this embodiment, the etching target layer 10, to which the processed pattern is transferred, is not formed using the porous layer 24, but instead the transfer oxide film 22 as in the case of the first embodiment. In the dry-etching of the first transfer-receiving oxide film 21 and the etching target layer 10 with the oxygen gas, the transfer oxide film 22 survives because the oxide film 22 is not etched before the first transfer-receiving oxide film 21 and the etching target layer 10 are etched.

Accordingly, this embodiment can provide a method capable of forming a microscopic pattern by using the nanoimprint lithography process even if the porous layer 24, which is less resistant to etching than the etching target layer 10, is formed between the etching target layer 10 and the organic material 25.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming method comprising:
   (a) forming a porous layer above an etching target layer;
   (b) forming an organic material with a transferred pattern on the porous layer;
   (c) forming, by use of the transferred pattern, a processed pattern in a transfer oxide film that is more resistant to etching than the porous layer, wherein the (c) forming includes:
      (c1) forming the transferred pattern in the porous layer, and
      (c2) forming, in the transfer oxide film, the processed pattern that is the same as the transferred pattern; and
   (d) transferring the processed pattern to the etching target layer by use of the transfer oxide film as a mask, wherein the (a) forming includes:
      (a1) forming the transfer oxide film on the etching target layer, and
      (a2) forming the porous layer on the transfer oxide film.

2. The pattern forming method according to claim 1, wherein the (c) forming includes:
   (c3) forming the transfer oxide film on the porous layer;
   (c4) etching back the transfer oxide film until a top surface of the porous layer is exposed; and
   (c5) removing the porous layer,
   wherein the forming the transferred pattern in the porous layer is by use of the organic material as a mask.

3. The pattern forming method according to claim 1, wherein, at the (c1) forming, the transferred pattern is formed in the porous layer using, as a mask, the organic material reduced down by etching sidewall portions of the organic material laterally inward.

4. The pattern forming method according to claim 3, wherein the sidewall portions of the organic material are etched laterally inward by an isotropic etching technique.

5. The pattern forming method according to claim 4, wherein, at the (c1) forming, the transferred pattern is formed in the porous layer by dry-etching the porous layer with a CF-based gas.

6. The pattern forming method according to claim 2, wherein the porous layer is made of an oxide film having a lower density than an oxide film formed by an LPCVD method.

7. The pattern forming method according to claim 3, wherein the porous layer is made of an oxide film having a lower density than an oxide film formed by an LPCVD method.

8. The pattern forming method according to claim 5, wherein the porous layer is made of an oxide film having a lower density than an oxide film formed by an LPCVD method.

9. The pattern forming method according to claim 1, wherein the porous layer has a density of 1.8 g/cm$^3$ or lower.

10. The pattern forming method according to claim 2, wherein the porous layer has a density of 1.8 g/cm$^3$ or lower.

11. The pattern forming method according to claim 3, wherein the porous layer has a density of 1.8 g/cm$^3$ or lower.

12. The pattern forming method according to claim 5, wherein the porous layer has a density of 1.8 g/cm$^3$ or lower.

* * * * *